(12) United States Patent
Chen et al.

(10) Patent No.: US 12,484,354 B2
(45) Date of Patent: Nov. 25, 2025

(54) LIGHT-EMITTING SUBSTRATE AND DISPLAY DEVICE

(71) Applicant: SUZHOU CHINA STAR OPTOELECTRONICS TECHNOLOGY CO., LTD., Suzhou (CN)

(72) Inventors: Lu Chen, Suzhou (CN); Qiong Liu, Suzhou (CN); Junjie Li, Suzhou (CN); Dan Cao, Suzhou (CN)

(73) Assignee: SUZHOU CHINA STAR OPTOELECTRONICS TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 17/793,748

(22) PCT Filed: Jul. 11, 2022

(86) PCT No.: PCT/CN2022/104968
§ 371 (c)(1),
(2) Date: Jul. 19, 2022

(87) PCT Pub. No.: WO2024/000638
PCT Pub. Date: Jan. 4, 2024

(65) Prior Publication Data
US 2024/0222549 A1    Jul. 4, 2024

(30) Foreign Application Priority Data
Jul. 1, 2022   (CN) .......................... 202210774756.6

(51) Int. Cl.
*H10H 20/856*   (2025.01)
*H01L 25/075*   (2006.01)
(Continued)

(52) U.S. Cl.
CPC ....... *H10H 20/856* (2025.01); *H01L 25/0753* (2013.01); *H10H 20/814* (2025.01); *H10H 20/84* (2025.01)

(58) Field of Classification Search
CPC ..... H10K 50/856; H10K 50/842–8428; H10K 50/85–858; H10K 59/12–131;
(Continued)

(56) References Cited

U.S. PATENT DOCUMENTS

2016/0238895 A1    8/2016   Choi et al.
2016/0363816 A1    12/2016  Song et al.
2021/0408166 A1*   12/2021  Yang ................... H10K 50/844

FOREIGN PATENT DOCUMENTS

CN    208738297 U    4/2019
CN    109950285 A    6/2019
(Continued)

OTHER PUBLICATIONS

PCT International Search Report for International Application No. PCT/CN2022/104968, mailed on Dec. 19, 2022, 8pp.
PCT Written Opinion of the International Search Authority for International Application No. PCT/CN2022/104968, mailed on Dec. 19, 2022, 9pp.
(Continued)

*Primary Examiner* — Karen Kusumakar
(74) *Attorney, Agent, or Firm* — The Roy Gross Law Firm, LLC; Roy D. Gross

(57) ABSTRACT

The present application provides a light-emitting substrate and a display device. The light-emitting substrate includes a driving substrate, a light guide functional layer and a reflective layer. The driving substrate is provided with multiple light-emitting devices and multiple support columns. The reflective layer is disposed on the driving substrate and arranged between the light-emitting devices. The reflective layer includes a reflective body and multiple low-reflection units. Each low-reflection unit is arranged around one support column. The reflective layer has greater reflectivity at a
(Continued)

position of the reflective body than at a position of each low-reflection unit.

20 Claims, 4 Drawing Sheets

(51) Int. Cl.
*H10H 20/814* (2025.01)
*H10H 20/84* (2025.01)

(58) Field of Classification Search
CPC .......... H10H 20/85–8516; H10H 20/855–856; H10H 29/30–49
See application file for complete search history.

(56) References Cited

FOREIGN PATENT DOCUMENTS

| | | |
|---|---|---|
| CN | 213399142 U | 6/2021 |
| CN | 215117082 U | 12/2021 |
| CN | 215680685 U | 1/2022 |
| CN | 114203879 A | 3/2022 |
| CN | 114578618 A | 6/2022 |
| KR | 20140089058 A | 7/2014 |
| WO | 2021227098 A1 | 11/2021 |

OTHER PUBLICATIONS

Chinese Office Action issued in corresponding Chinese Patent Application No. 202210774756.6 dated Apr. 26, 2025, pp. 1-8, 16pp.

* cited by examiner

LIGHT-EMITTING SUBSTRATE AND DISPLAY DEVICE

This application is a National Phase of PCT Patent Application No. PCT/CN2022/104968 having International filing date of Jul. 11, 2022, which claims the benefit of priority of Chinese Patent Application No. 202210774756.6, filed Jul. 1, 2022, the contents of which are all incorporated herein by reference in their entirety.

FIELD OF DISCLOSURE

The present application relates to a field of display technology and in particular, to a light-emitting substrate and a display device.

DESCRIPTION OF RELATED ART

With the development of display technology, mini light-emitting diode (mini LED) used in a display light-emitting device has received extensive attention.

At present, a conventional mini LED light-emitting substrate mainly includes a light plate, a light guide film layer such as a diffuser plate, and a support element between the light plate and the diffuser plate. Influenced by light reflection between the reflective film layer of the light plate and the support element, light gathers near the support element, which causes light output of the mini LED light-emitting substrate to have uneven brightness.

SUMMARY

The present application is directed to providing a light-emitting substrate and a display device for solving a technical problem of uneven brightness and darkness of the light-emitting substrate.

Accordingly, the present application provides a light-emitting substrate, including:
  a driving substrate, wherein a plurality of light-emitting devices are arranged on the driving substrate;
  a plurality of support columns arranged at intervals on the driving substrate, and located between the light-emitting devices;
  a light guide functional layer disposed on one side of the support columns away from the driving substrate; and
  a reflective layer disposed on the driving substrate and between the light-emitting devices;
  wherein the reflective layer includes a reflective body and a plurality of low-reflection units, each of the low-reflection units surrounds one of the support columns, and the reflective layer has greater reflectivity at a position of the reflective body than at a position of each of the low-reflection units.

In the light-emitting substrate of the present application, each of the low-reflection units includes an opening defined in the reflective layer, and a depth of each of the openings is equal to a thickness of the reflective layer.

In the light-emitting substrate of the present application, each of the low-reflection units includes an opening defined in the reflective layer and a low-reflection portion located in the opening, a depth of each of the openings is less than or equal to a thickness of the reflective layer, and reflectivity of the reflective body is greater than reflectivity of each of the low-reflection portions.

In the light-emitting substrate of the present application, the depth of each of the openings is zero.

In the light-emitting substrate of the present application, the opening of each of the low-reflection units has a ring shape and surrounds one of the support columns.

In the light-emitting substrate of the present application, the opening of each of the low-reflection units includes a plurality of sub-openings arranged around one of the support columns.

In the light-emitting substrate of the present application, in one of the support columns and the sub-openings arranged corresponding to this support column, an opening width of each of the sub-openings gradually decrease in a direction away from the support column.

In the light-emitting substrate of the present application, a material of each of the low-reflection portions is ink.

In the light-emitting substrate of the present application, the reflective layer includes a plurality of through holes, and one end of each of the support columns away from the light guide functional layer is connected to the driving substrate through one of the through holes; and
  the low-reflection units are spaced from the through holes, and a distance between each of the low-reflection units and the corresponding through hole is greater than or equal to 1.5 mm.

In the light-emitting substrate of the present application, in one of the support columns and a corresponding one of the low-reflection units, a distance between the low-reflection unit and the support column is less than a distance between the low-reflection unit and any one of the light-emitting units.

In the light-emitting substrate of the present application, a distance between the driving substrate and the light guide functional layer is in a range from 2 mm to 10 mm.

The present application further provides a display device, including a light-emitting substrate and a display panel disposed on a light-emitting side of the light-emitting substrate, wherein the light-emitting substrate includes:
  a driving substrate, wherein a plurality of light-emitting devices are arranged on the driving substrate;
  a plurality of support columns arranged at intervals on the driving substrate, and located between the light-emitting devices;
  a light guide functional layer disposed on one side of the support columns away from the driving substrate; and
  a reflective layer disposed on the driving substrate and between the light-emitting devices;
  wherein the reflective layer includes a reflective body and a plurality of low-reflection units, each of the low-reflection units surrounds one of the support columns, and the reflective layer has greater reflectivity at a position of the reflective body than at a position of each of the low-reflection units.

In the display device of the present application, each of the low-reflection units includes an opening defined in the reflective layer, and a depth of each of the openings is equal to a thickness of the reflective layer.

In the display device of the present application, each of the low-reflection units includes an opening defined in the reflective layer and a low-reflection portion located in the opening, a depth of each of the openings is less than or equal to a thickness of the reflective layer, and reflectivity of the reflective body is greater than reflectivity of each of the low-reflection portions.

In the display device of the present application, the depth of each of the openings is zero.

In the display device of the present application, the opening of each of the low-reflection units has a ring shape and surrounds one of the support columns.

In the display device of the present application, the opening of each of the low-reflection units includes a plurality of sub-openings arranged around one of the support columns.

In the display device of the present application, in one of the support columns and the sub-openings arranged corresponding to this support column, an opening width of each of the sub-openings gradually decrease in a direction away from the support column.

In the display device of the present application, the reflective layer includes a plurality of through holes, and one end of each of the support columns away from the light guide functional layer is connected to the driving substrate through one of the through holes; and the low-reflection units are spaced from the through holes, and a distance between each of the low-reflection units and the corresponding through hole is greater than or equal to 1.5 mm.

In the display device of the present application, in one of the support columns and a corresponding one of the low-reflection units, a distance between the low-reflection unit and the support column is less than a distance between the low-reflection unit and any one of the light-emitting units.

Advantages of the Present Application

The reflective layer is divided into the reflective body and multiple low-reflection units. Each of the low-reflection units is arranged around one of the support columns, and the reflective layer has greater reflectivity at the position of the reflective body than at the position of each of the low-reflection units, thereby reducing the reflectivity of the reflective layer near the support column, and preventing light from gathering at a position of the support column to cause uneven light output and uneven brightness of the light-emitting substrate. Accordingly, the present application can ensure the uniformity of light output from the light-emitting substrate.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
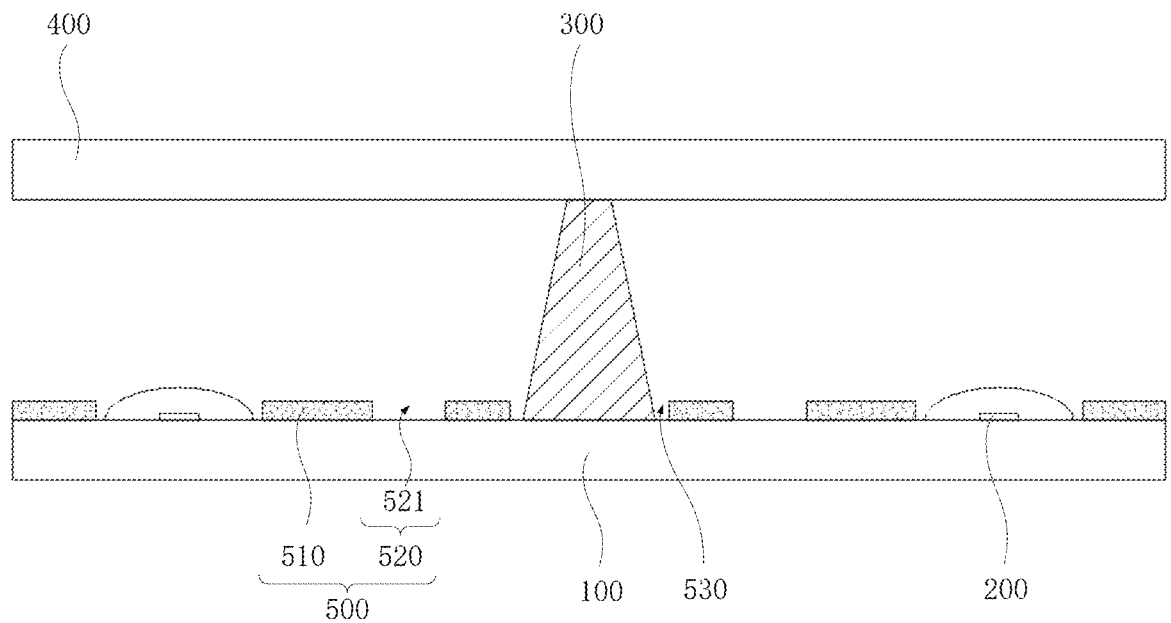
FIG. 1 is a schematic view of a first type of film layer structure, a light-emitting substrate according to one embodiment of the present application.
Figure 2:
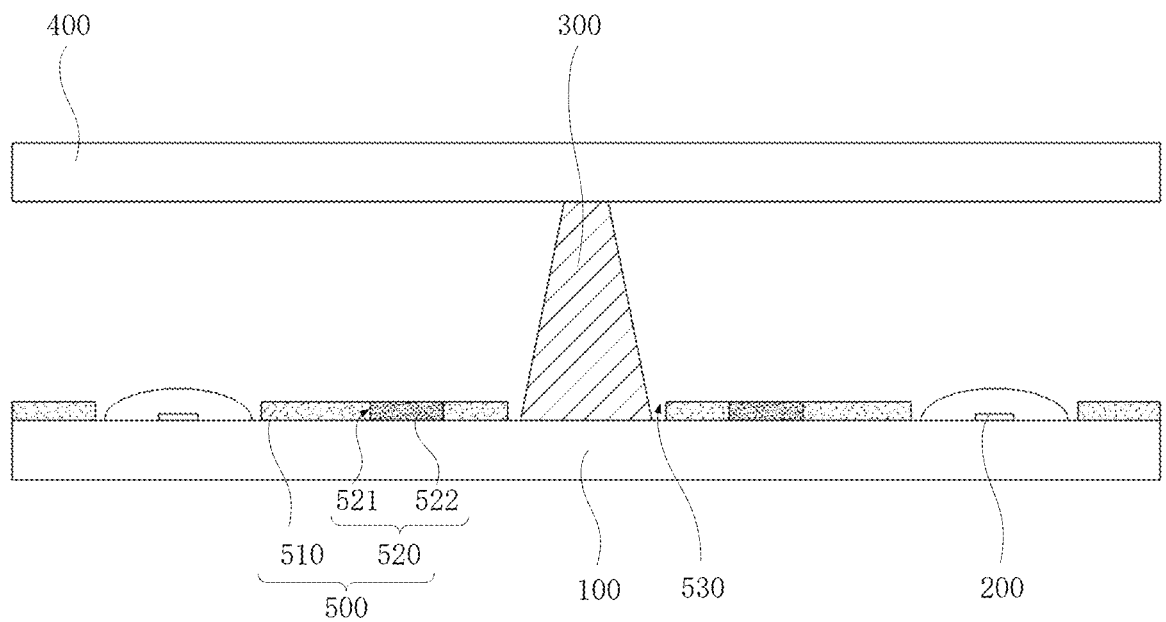
FIG. 2 is a schematic view of a second type of film layer structure of the light-emitting substrate according to one embodiment of the present application.

The present application is described below with reference to the accompanying drawings and in conjunction with specific embodiments. The directional terms mentioned in the present invention, such as "up", "down", "front", "rear", "left", "right", "inner", "outer", "lateral", etc., are only for illustrative purposes based on the accompanying drawings. Therefore, the directional terms are used for ease of describing and understanding the present invention, but not for limiting the present invention. In the drawings, structurally similar elements are denoted by the same reference numerals.

In the description of the present application, it should be understood that the terms "first" and "second" are only used for illustrative purposes, and cannot be interpreted as indicating or implying relative importance or implicitly indicating the number of an indicated technical feature. Thus, the feature defined as "first" and "second" can expressly or implicitly include one or more of said feature. In the description of the present application, "multiple" means two or more, unless otherwise expressly and specifically defined.

In the present application, it should be noted that, unless otherwise expressly specified and defined, the terms "mounted", "connected", and "coupled" should be understood in a broad sense. For example, elements can be a fixedly connected, detachably connected, or integrally connected; elements can be a mechanically connected or electrically connected, or can communicate with each other; elements can be directly connected or indirectly connected through an intermediate medium; two elements can have internal communication with each other or interaction with each other. For those of ordinary skill in the art, the specific meanings of the above terms in the present application can be understood on a case-by-case basis.

The present application is described with reference to specific embodiments.

The present application provides a light-emitting substrate. Please refer to FIG. 1 to FIG. 6. The light-emitting substrate includes:

a driving substrate 100 on which a plurality of light-emitting devices 200 are disposed;

a plurality of support columns 300 arranged at intervals on the driving substrate 100 and located between the light-emitting devices 200;

a light guide functional layer 400 disposed on one side of the support columns 300 away from the driving substrate 100; and a reflective layer 500 disposed on the driving substrate 100 and located between the light-emitting devices 200;

wherein the reflective layer 500 includes a reflective body 510 and a plurality of low-reflection units 520, each of the low-reflection units 520 surrounds one of the support columns 300, and the reflective layer 500 has greater reflectivity at a position of the reflective body 510 than at a position of each of the low-reflection unit 520. The reflectivity at the position of the reflective body 510 and the reflectivity at the position of the low-reflection unit 520 is compared on the basis that incident light incident at the position of the reflective body 510 and incident light incident at the position of the low-reflection unit 520 have the same wavelength and incident angle.

It can be understood that a conventional mini LED light-emitting substrate mainly includes a light plate, a light guide film layer such as a diffuser plate, and a support element located between the light plate and the diffuser plate. Influenced by light reflection between a reflective film layer on the light plate and the support member, light gathers near the support element, resulting in uneven brightness and darkness of the mini LED light-emitting substrate. In the present embodiment, the reflective layer 500 is divided into the reflective body 510 and multiple low-reflection units 520. Each of the low-reflection units 520 is arranged around one of the support columns 300, and the reflective layer 500 has greater reflectivity at the position of the reflective body 510 than at the position of each of the low-reflection units, thereby reducing the reflectivity of the reflective layer 500 near the support column 300, and preventing light from gathering at a position of the support column 300 to cause uneven light output and uneven brightness of the light-emitting substrate. Accordingly, the present application can ensure the uniformity of light output from the light-emitting substrate.

It should be noted that, in the present embodiment, the light guide functional layer 400 can include a diffuser plate, and a distance between the driving substrate and the light guide functional layer can be adjusted according to actual needs, so as to prevent the light-emitting substrate from having light gathering at the position of the support column 300 to cause uneven light output and uneven brightness, thereby ensuring uniform light output from the light-emitting substrate. Specifically, a distance between the driving substrate and the light guide functional layer is in a range from 2 mm to 10 mm, so that the light emitted by the light-emitting substrate at the position of the support column 300 has a slightest difference in brightness from the light emitted at other positions. Accordingly, a brightness difference between the light emitted from the light-emitting substrate at the position of the support column 300 and the light emitted at other positions is minimized, and the uniformity of the light emitted from the light-emitting substrate is optimized.

Figure 4:
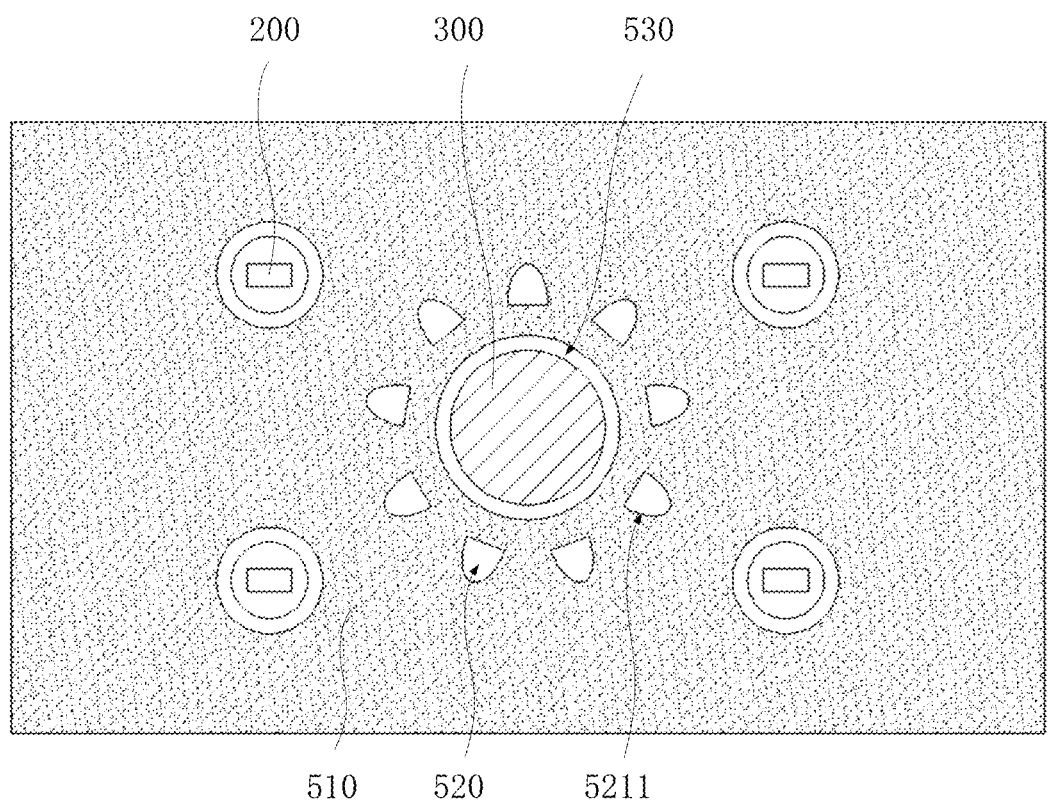
FIG. 4 is a first top view of the light-emitting substrate according to one embodiment of the present application.

In one embodiment, please refer to FIG. 1 and FIG. 4, each low-reflection unit 520 includes an opening 521 defined in the reflective layer 500, and a depth of the opening 521 is equal to a thickness of the reflective layer 500.

It can be understood that each low-reflection unit 520 includes the opening 521 defined in the reflective layer 500. Under the condition that the depth of the opening 521 is equal to the thickness of the reflective layer 500, the driving substrate 100 is exposed at positions of the openings 521. Obviously, the reflectivity of the reflective body 510 is greater than the reflectivity of the driving substrate 100, so that the reflective layer 500 has greater reflectivity at the position of the reflective body 510 than at the position of the low-reflection unit 520, thereby preventing uneven light output and uneven brightness of the light-emitting substrate, which results from light gathering at the position of the support column 300.

In one embodiment, please refer to FIG. 2, FIG. 3, FIG. 5, and FIG. 6, the low-reflection unit 520 includes the opening 521 defined in the reflective layer 500 and the low-reflection portion 522 located inside the opening 521. The depth of the opening 521 is less than or equal to the thickness of the reflective layer 500, and reflectivity of the reflective body 510 is greater than reflectivity of the low-reflection portion 522.

It can be understood that the low-reflection unit 520 includes the opening 521 defined in the reflective layer 500 and the low-reflection portion 522 located in the opening 521. The reflectivity of the reflective body 510 is greater than the reflectivity of the low-reflection portion 522. By filling the opening 521 with the low-reflection portion 522 whose reflectivity is lower than the reflectivity of the reflective body 510, the reflectivity of the reflective layer 500 at the position of the reflective body 510 is greater than the reflectivity of the reflective layer 500 at the position of the low-reflection unit 520, thereby preventing light from gathering at the positions of the support columns 300, which causes uneven light output and uneven brightness of the light-emitting substrate. In the present embodiment, the depth of the opening 521 can be less than the thickness of the reflective layer 500 or can be equal to the thickness of the reflective layer 500. The opening 521 can be filled by the low-reflection portion 522. A surface of the low-reflection portion 522 on one side away from the driving substrate 100 can be coplanar with a surface of the reflective body 510 on one side away from the driving substrate 100, thereby ensuring flatness of the reflective layer 500.

In the present embodiment, a material of the low-reflection portion 522 is ink. Obviously, the ink selected in the present embodiment has lower reflectivity than the reflectivity of the reflecting body 510. In actual production, ink is applied at the position of the opening 521 to form the low-reflection portion 522, which not only reduces manufacturing costs of the low-reflection portion 522 but also ensures the flatness of the reflective layer 500. Specifically, the material of the low-reflection portion 522 can be selected from different colors of ink according to specific needs, and the material of the low-reflection portion 522 can be gray ink, brown ink, black ink, and the like.

Figure 3:
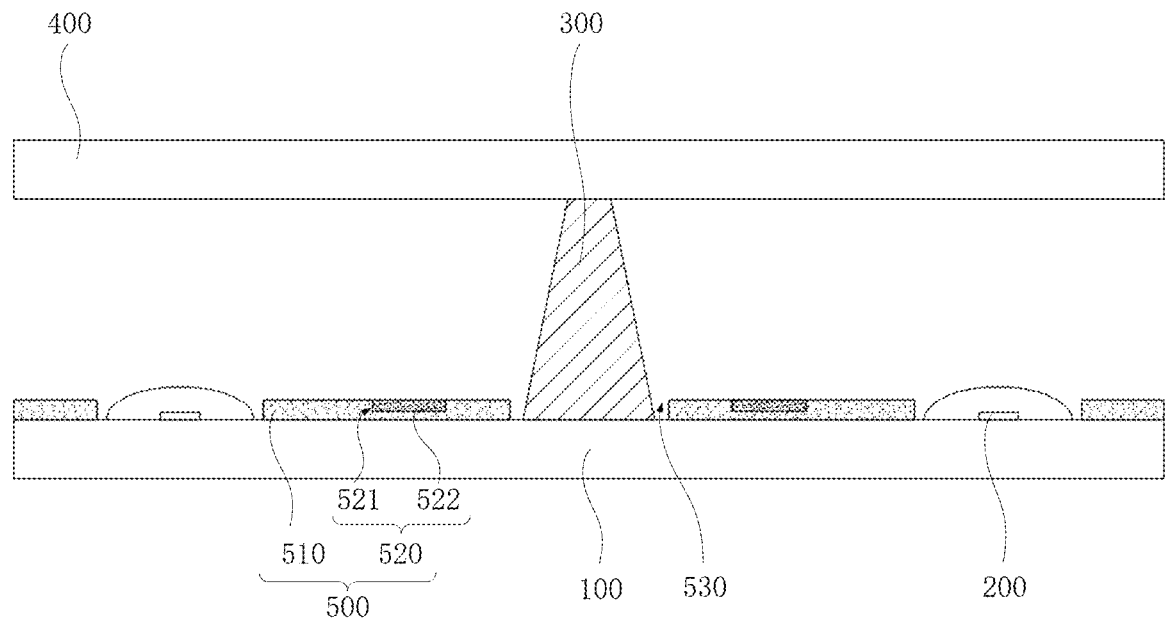
FIG. 3 is a schematic view of a third type of film layer structure of the light-emitting substrate according to one embodiment of the present application.

In another embodiment, the light-emitting substrate has substantially the same structure as the structure of the light-emitting substrate shown in FIG. 3. The difference is that the depth of the opening 521 is zero. That is to say, the low-reflection unit 520 directly covers the reflective layer 500, and the opening 521 is no longer provided at the position where the low-reflection unit 520 covers the reflective layer 500. The low-reflection unit 520 can be a coating, and a material of the coating can be ink with a reflectivity lower than the reflectivity of the reflective body 510.

Figure 6:
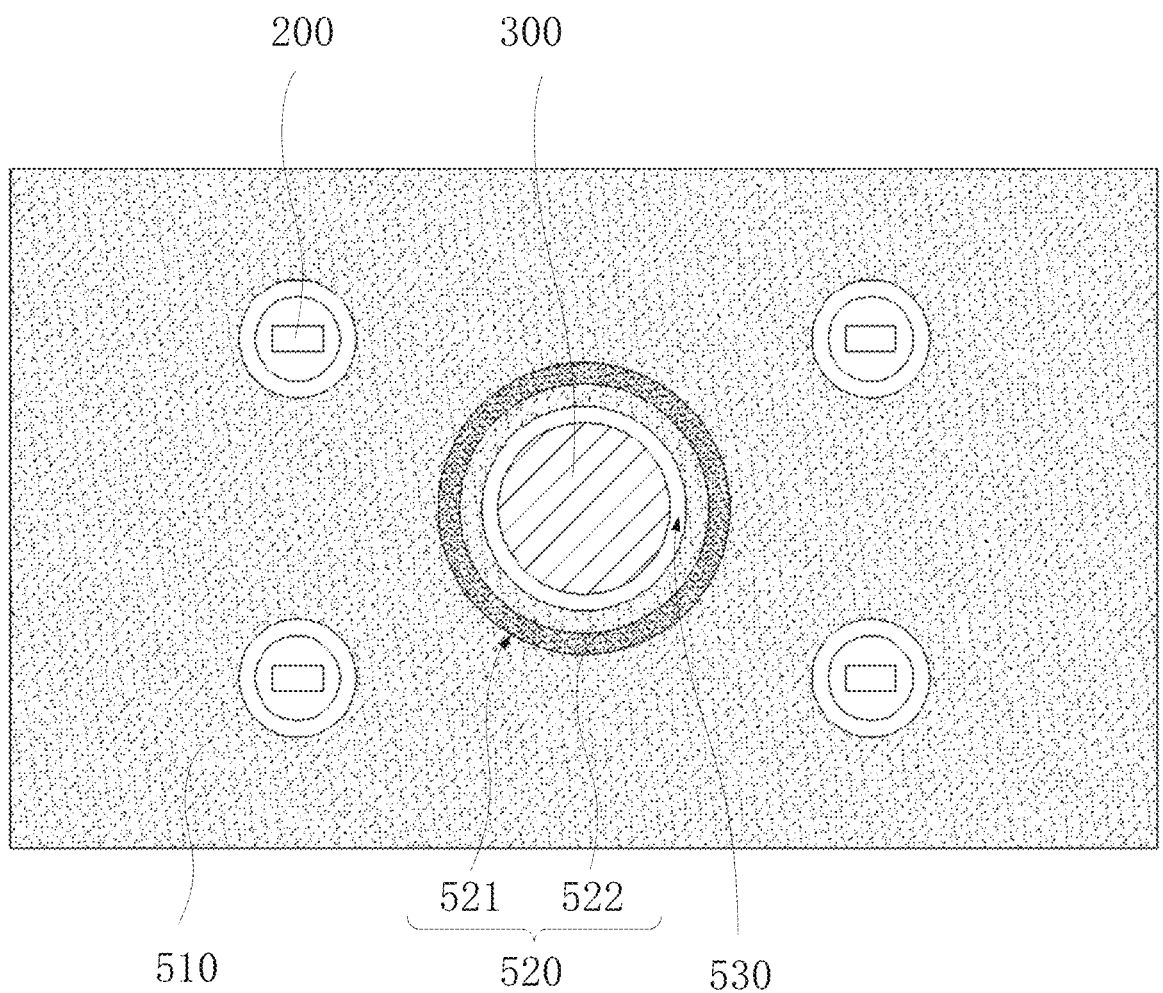
FIG. 6 is a third top view of the light-emitting substrate according to one embodiment of the present application.

In one embodiment, please refer to FIG. 6. The opening 521 has a ring shape and surrounds the support column 300.

It can be understood that the opening 521 can has a ring shape surrounding the support column 300, so that the reflectivity of the reflective layer 500 around the support column 300 can be reduced at various angles. Therefore, the overall brightness around the support column 300 is reduced more uniformly, and a problem of inconsistent brightness reduction around the support column 300 can also be prevented. In the present embodiment, the shape of the ring-shaped opening 521 can be matched with a shape of the support column 300, at any described position.

Figure 5:
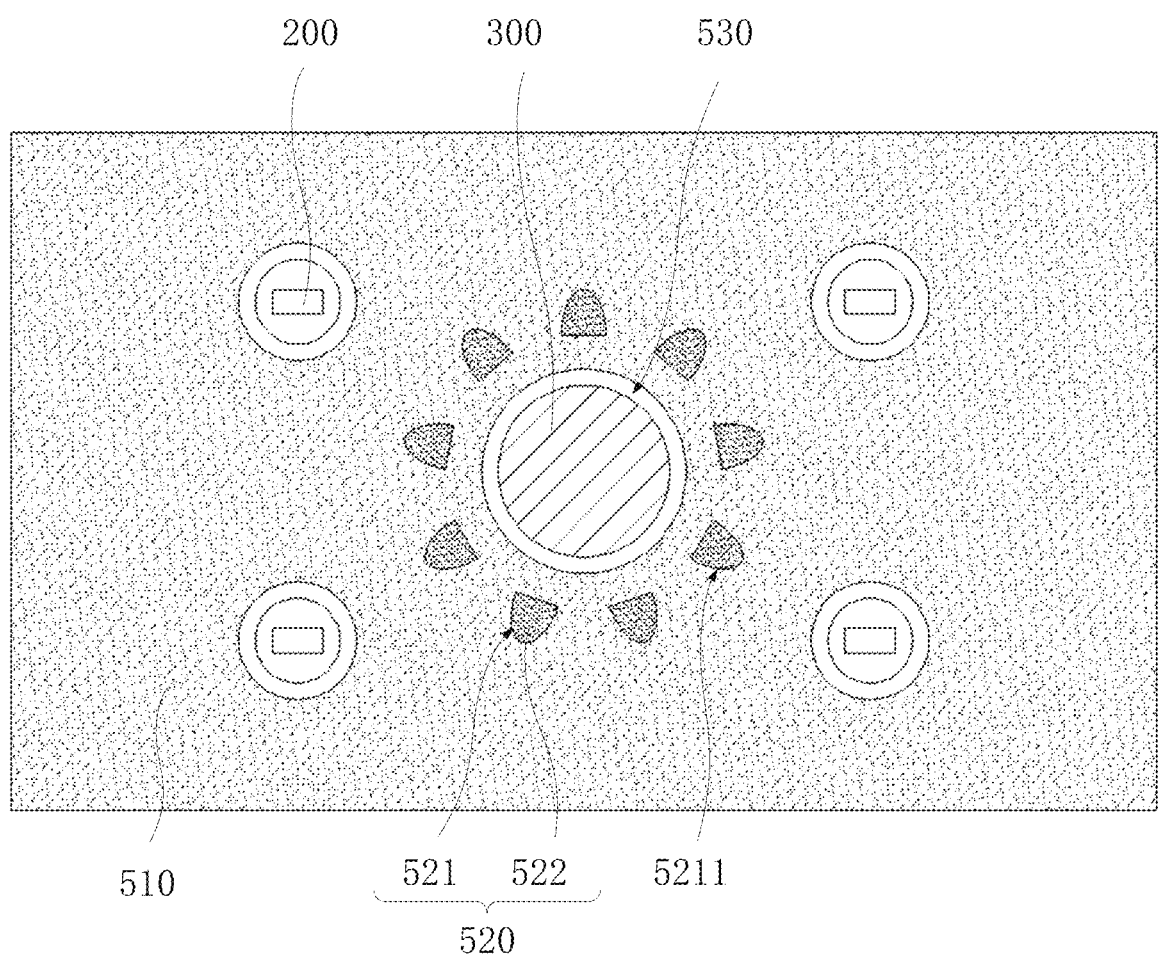
FIG. 5 is a second top view of the light-emitting substrate according to one embodiment of the present application.

In one embodiment, as shown in FIG. 4 and FIG. 5, the opening 521 includes a plurality of sub-openings 5211 disposed around the support column 300.

It can be understood that the opening 521 includes a plurality of sub-openings 5211 disposed around the support column 300, and the sub-openings 5211 are evenly arranged around the support column 300. An interval between any two adjacent sub-openings 5211 is equal, so that the overall brightness around the support column 300 is reduced more uniformly. In the present embodiment, the opening 521 is configured to include multiple sub-openings. Therefore, when the depth of the opening 521 is equal to the depth of the reflective layer 500, the reflective layer 500 is prevented from being divided into multiple separate parts by the ring-shaped opening 521. Accordingly, the present application ensures the integrity of the reflective layer 500.

In addition, in the present embodiment, in one of the support columns 300 and the corresponding sub-openings 5211, an area of each of the sub-openings 5211 gradually decrease in a direction away from the support column 300.

It can be understood that by dividing the opening 521 into multiple sub-openings 5211 arranged around the support column 300, a shape of each of the sub-openings 5211 can be adjusted according to the actually required light brightness. In the present embodiment, in one support column 300 and the corresponding multiple sub-openings 5211, an opening width of each of the sub-openings 5211 gradually decreases in the direction away from the support column 300. Obviously, in the direction away from the support column 300, the light gathered around the support column 300 gradually decreases. Therefore, by gradually reducing the opening width of the sub-opening 5211 in the direction away from the support column 300, the brightness of the light emitted at the position of the support column 300 can be decreased, and the uniformity of the light emitted from the light-emitting substrate can also be ensured.

In one embodiment, as shown in FIG. 1 to FIG. 6, the reflective layer 500 includes a plurality of through holes 530. One end of each support column 300 away from the light guide functional layer 400 is connected to the driving substrate 100 through one of the through holes 530.

The low-reflection units 520 are spaced apart from the through holes 530. A distance between the low-reflection unit 520 and the through hole 530 is greater than or equal to 1.5 mm.

It can be understood that the reflective layer 500 includes multiple through holes 530. One end of each support column 300 away from the light guide functional layer 400 is connected to the driving substrate 100 through one of the through holes 530. In one support column 300 and the corresponding through hole 530, a diameter of the through hole 530 is greater than a diameter of the support column 300. The low-reflection unit 520 is spaced apart from the through hole 530. That is to say, the opening 521 of the low-reflection unit 520 is spaced from the through hole 530. Obviously, the opening 521 is spaced apart from the through hole 530, and a distance between the low-reflection unit 520 and the through hole 530 is greater than or equal to 1.5 mm, so that the distance between the opening 521 and the through hole 530 is prevented from being too close and increasing the difficulty of manufacturing the opening 521 and the through hole 530 in the reflective layer 500.

Please refer to FIG. 1 to FIG. 6, in one embodiment, in one support column 300 and the corresponding low-reflection unit 520, the distance between the low-reflection unit 520 and the support column 300 is less than the distance between the low-reflection unit 520 and any one of the light-emitting units.

It can be understood that, in one support column 300 and the corresponding low-reflection unit 520, the distance between the low-reflection unit 520 and the support column 300 is less than the distance between the low-reflection unit 520 and any of the light-emitting units. By setting the distance between the low-reflection unit 520 and the support column 300 to be less than the distance between the low-reflection unit 520 and any of the light-emitting units, the low-reflection unit 520 less influences the light output of the light-emitting substrate at the positions of the light-emitting devices 200. Accordingly, the light-emitting substrate can prevent light from gathering at the position of the support column 300 to cause uneven light output of the light-emitting substrate. At the same time, the present application prevents to the greatest extent possible the brightness of the light emitted by the light-emitting substrate at the positions of the light-emitting devices 200 from being affected.

The present application also provides a display device, including the light-emitting substrate as described in any one of the previous embodiments, and a display panel disposed on a light-emitting side of the light-emitting substrate. For the specific structure of the light-emitting substrate, reference can be made to the foregoing embodiments, and a detailed description is omitted here. It should be noted that the light-emitting substrate can be used for display alone, or can be used as a backlight module of the display device. In the present embodiment, the display panel is a liquid crystal display panel, and the light-emitting substrate is used as a backlight module arranged on a light input side of the display panel.

The present application provides the light-emitting substrate. The reflective layer 500 is divided into the reflective body 510 and multiple low-reflection units 520. Each low-reflection unit 520 is arranged around one of the support columns 300, and the reflective layer 500 has greater reflectivity at the position of the reflective body 510 than at the position of the low-reflection unit 520, thereby reducing the reflectivity of the reflective layer 500 near the support column 300 and preventing light from gathering at the position of the support column 300 to cause uneven light output of the light-emitting substrate. Accordingly, the present application ensures the uniformity of the light emitted from the light-emitting substrate.

In summary, although the present invention has been described above with preferred embodiments, the above preferred embodiments are not intended to limit the present invention. Those of ordinary skill in the art can make various changes and modifications without departing from the spirit and scope of the present application. Therefore, the protection scope of the present invention is defined by the accompanying claims.

What is claimed is:

1. A light-emitting substrate, comprising:
a driving substrate, wherein a plurality of light-emitting devices are arranged on the driving substrate;
a plurality of support columns arranged at intervals on the driving substrate, and located between the light-emitting devices;
a light guide functional layer disposed on one side of the support columns away from the driving substrate; and
a reflective layer disposed on the driving substrate and between the light-emitting devices;
wherein the reflective layer comprises a reflective body and a plurality of low-reflection units, each of the low-reflection units surrounds one of the support columns, and the reflective layer has greater reflectivity at a position of the reflective body than at a position of each of the low-reflection units;
wherein each of the low-reflection units comprises an opening defined in the reflective layer, a depth of each of the openings is equal to a thickness of the reflective layer, and the opening of each of the low-reflection units comprises a plurality of sub-openings arranged around one of the support columns;
wherein in one of the support columns and the sub-openings arranged corresponding to this support column, an opening width of each of the sub-openings gradually decrease in a direction away from the support column.

2. The light-emitting substrate according to claim 1, wherein each of the low-reflection units comprises an opening defined in the reflective layer and a low-reflection portion located in the opening, a depth of each of the openings is less than or equal to a thickness of the reflective layer, and reflectivity of the reflective body is greater than reflectivity of each of the low-reflection portions.

3. The light-emitting substrate according to claim 1, wherein the opening of each of the low-reflection units has a ring shape and surrounds one of the support columns.

4. The light-emitting substrate according to claim 1, wherein a material of each of the low-reflection portions is ink.

5. The light-emitting substrate according to claim 1, wherein the reflective layer comprises a plurality of through holes, and one end of each of the support columns away from the light guide functional layer is connected to the driving substrate through one of the through holes; and
the low-reflection units are spaced from the through holes, and a distance between each of the low-reflection units and the corresponding through hole is greater than or equal to 1.5 mm.

6. The light-emitting substrate according to claim 1, wherein in one of the support columns and a corresponding one of the low-reflection units, a distance between the low-reflection unit and the support column is less than a distance between the low-reflection unit and any one of the light-emitting units.

7. The light-emitting substrate according to claim 1, wherein a distance between the driving substrate and the light guide functional layer is in a range from 2 mm to 10 mm.

8. A display device, comprising a light-emitting substrate and a display panel disposed on a light-emitting side of the light-emitting substrate;
wherein the light-emitting substrate comprises:
a driving substrate, wherein a plurality of light-emitting devices are arranged on the driving substrate;
a plurality of support columns arranged at intervals on the driving substrate, and located between the light-emitting devices;
a light guide functional layer disposed on one side of the support columns away from the driving substrate; and
a reflective layer disposed on the driving substrate and between the light-emitting devices;
wherein the reflective layer comprises a reflective body and a plurality of low-reflection units, each of the low-reflection units surrounds one of the support columns, and the reflective layer has greater reflectivity at a position of the reflective body than at a position of each of the low-reflection units;
wherein each of the low-reflection units comprises an opening defined in the reflective layer, a depth of each of the openings is equal to a thickness of the reflective layer, and the opening of each of the low-reflection units comprises a plurality of sub-openings arranged around one of the support columns;
wherein in one of the support columns and the sub-openings arranged corresponding to this support column, an opening width of each of the sub-openings gradually decrease in a direction away from the support column.

9. The display device according to claim 8, wherein each of the low-reflection units comprises an opening defined in the reflective layer and a low-reflection portion located in the opening, a depth of each of the openings is less than or equal to a thickness of the reflective layer, and reflectivity of the reflective body is greater than reflectivity of each of the low-reflection portions.

10. The display device according to claim 8, wherein the opening of each of the low-reflection units has a ring shape and surrounds one of the support columns.

11. The display device according to claim 8, wherein the reflective layer comprises a plurality of through holes, and one end of each of the support columns away from the light guide functional layer is connected to the driving substrate through one of the through holes; and
the low-reflection units are spaced from the through holes, and a distance between each of the low-reflection units and the corresponding through hole is greater than or equal to 1.5 mm.

12. The display device according to claim 8, wherein in one of the support columns and a corresponding one of the low-reflection units, a distance between the low-reflection unit and the support column is less than a distance between the low-reflection unit and any one of the light-emitting units.

13. A light-emitting substrate, comprising:
a driving substrate, wherein a plurality of light-emitting devices are arranged on the driving substrate;
a plurality of support columns arranged at intervals on the driving substrate, and located between the light-emitting devices;
a light guide functional layer disposed on one side of the support columns away from the driving substrate; and
a reflective layer disposed on the driving substrate and between the light-emitting devices, wherein the reflective layer comprises a plurality of through holes, and one end of each of the support columns away from the light guide functional layer is connected to the driving substrate through one of the through holes;
wherein the reflective layer comprises a reflective body and a plurality of low-reflection units, each of the low-reflection units surrounds one of the support columns, the reflective layer has greater reflectivity at a position of the reflective body than at a position of each of the low-reflection units, the low-reflection units are spaced from the through holes, and a distance between each of the low-reflection units and the corresponding through hole is greater than or equal to 1.5 mm.

14. The light-emitting substrate according to claim 13, wherein each of the low-reflection units comprises an opening defined in the reflective layer, and a depth of each of the openings is equal to a thickness of the reflective layer.

15. The light-emitting substrate according to claim 13, wherein each of the low-reflection units comprises an opening defined in the reflective layer and a low-reflection portion located in the opening, a depth of each of the openings is less than or equal to a thickness of the reflective layer, and reflectivity of the reflective body is greater than reflectivity of each of the low-reflection portions.

16. The light-emitting substrate according to claim 14, wherein the opening of each of the low-reflection units has a ring shape and surrounds one of the support columns.

17. The light-emitting substrate according to claim 14, wherein the opening of each of the low-reflection units comprises a plurality of sub-openings arranged around one of the support columns.

18. The light-emitting substrate according to claim 17, wherein in one of the support columns and the sub-openings arranged corresponding to this support column, an opening width of each of the sub-openings gradually decrease in a direction away from the support column.

19. The light-emitting substrate according to claim 13, wherein a material of each of the low-reflection portions is ink.

20. The light-emitting substrate according to claim 13, wherein in one of the support columns and a corresponding one of the low-reflection units, a distance between the low-reflection unit and the support column is less than a distance between the low-reflection unit and any one of the light-emitting units.

* * * * *